United States Patent
Chang et al.

(10) Patent No.: US 11,145,702 B2
(45) Date of Patent: Oct. 12, 2021

(54) BOUNDARY PANEL LAYOUT FOR ARTIFACT COMPENSATION IN MULTI-PIXEL DENSITY DISPLAY PANEL

(71) Applicant: Google LLC, Mountain View, CA (US)

(72) Inventors: Sun-Il Chang, San Jose, CA (US); Sangmoo Choi, Palo Alto, CA (US); Hyunchul Kim, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/830,750

(22) Filed: Mar. 26, 2020

(65) Prior Publication Data

US 2021/0126059 A1    Apr. 29, 2021

Related U.S. Application Data

(60) Provisional application No. 62/927,319, filed on Oct. 29, 2019.

(51) Int. Cl.
*H01L 27/32* (2006.01)

(52) U.S. Cl.
CPC ........ *H01L 27/326* (2013.01); *H01L 27/3234* (2013.01)

(58) Field of Classification Search
CPC .................................................... H01L 27/326
See application file for complete search history.

(56) References Cited

U.S. PATENT DOCUMENTS 6,151,001 A * 11/2000 Anderson ............ G09G 3/2965
345/63
7,714,923 B2   5/2010 Cok et al.
10,879,330 B1 * 12/2020 Cui ..................... H04M 1/0264
2013/0093646 A1 * 4/2013 Curtis ............... G02F 1/133606
345/1.3
2017/0220182 A1   8/2017 Schwartz et al.
2020/0043994 A1 * 2/2020 Chen .................... H01L 27/3234
2020/0394964 A1 * 12/2020 Hyun .................. G09G 3/3275

FOREIGN PATENT DOCUMENTS

| CN | 207517341 | 6/2018 |
| CN | 108647606 | 10/2018 |
| EP | 3428967 | 1/2019 |
| EP | 3611718 | 2/2020 |
| WO | WO 2019/062176 | 4/2019 |

OTHER PUBLICATIONS

PCT International Search Report and Written Opinion in International Appln. No. PCT/US2020/051200, dated Jan. 12, 2021, 15 pages.
TW Office Action in Taiwanese Appln. No. 109132062, dated Jun. 24, 2021, 15 pages (with English translation).

* cited by examiner

*Primary Examiner* — Douglas M Menz
(74) *Attorney, Agent, or Firm* — Fish & Richardson P.C.

(57) ABSTRACT

A display panel includes a plurality of array sites arranged in an array defined by a plurality of rows and a plurality of columns. The display panel includes a first area of the array having a first pixel density and a second area of the array having a second pixel density lower than the first pixel density. The second area of the array includes a plurality of the array sites that are devoid of pixels. Rows of the second area that border the first area include at least one pixel and columns of the second area that border the first area include at least one pixel.

19 Claims, 2 Drawing Sheets

BOUNDARY PANEL LAYOUT FOR ARTIFACT COMPENSATION IN MULTI-PIXEL DENSITY DISPLAY PANEL

CROSS REFERENCE TO RELATED APPLICATIONS

This application claims benefit of U.S. Provisional Application No. 62/927,319, filed on Oct. 29, 2019, and titled "BOUNDARY PANEL LAYOUT FOR ARTIFACT COMPENSATION IN MULTI-PIXEL DENSITY DISPLAY PANEL," which is incorporated by reference in its entirety.

BACKGROUND

Electronic devices can include display panels.

SUMMARY

This specification describes techniques, methods, systems, and other mechanisms for artifact compensation. A multi-pixel density display panel may be used so that a camera may be placed behind an area of the display panel that has a lower pixel density so that the display panel causes less degradation in quality of images captured by the camera compared to placing the camera behind an area of the display with higher pixel density.

For example, the display panel may have more open spaces in the area that has lower pixel density so that light that passes through the display panel in that area undergoes less interference (e.g., attenuation, diffraction and/or scatter) than light that passes through the display panel in an area with higher pixel density. Similarly, various sensors such as an ambient light sensor, depth sensor, or some other sensor may additionally or alternatively be placed behind the area with lower resolution to reduce interference caused by the display panel.

The difference in pixel density between areas may be apparent to viewers where the areas border each other. For example, the drop in pixel density by a quarter may be very noticeable to a person viewing the display panel. The difference may be visibly jarring to a user and may distract a user. To compensate for differences, a system may adjust what is displayed where the first area borders the second area to hide the difference in the pixel density of the areas of the display panel from viewers so that users may not even realize the display panel has areas with different pixel densities. For example, the system may darken or turn off some pixels in the first area that border the second area.

However, compensating for differences in pixel density of areas in a display panel to reduce an appearance of a boundary may result in artifacts being displayed. For example, a portion of a lower pixel density area that is adjacent and shares a boundary with a higher pixel density area may be devoid of pixels and to reduce an appearance of a boundary, the pixels in the higher pixel density area near the boundary may also be darkened or turned off, creating a dark artifact.

In more detail, the lower pixel density area and the higher pixel density area may include a plurality of array sites arranged in an array. Each of the array sites may either include a pixel or not include a pixel. For example, the lower pixel density area may have a quarter of the pixels in the higher pixel density, so for every four array sites in the higher pixel density that includes a pixel, the lower pixel density area may have both three array sites devoid of pixels and one array site with a pixel. If a boundary of the lower pixel density area includes only array sites devoid of pixels and pixels in the higher pixel density area that are adjacent to the boundary are also darkened or turned off, a dark artifact may appear at the boundary.

Artifact compensation for multi-pixel density display panels may be done by arranging pixels in the lower pixel density area such that the array sites of the lower pixel density at every boundary shared between the lower pixel density area and the higher pixel density area each include at least one pixel. Accordingly, large groups of array sites devoid of pixels or dark/turned off pixels may be avoided, reducing the appearance of dark artifacts in the display.

One innovative aspect of the subject matter described in this specification is embodied in a display panel that includes a plurality of array sites arranged in an array defined by a plurality of rows and a plurality of columns. The display panel includes a first area of the array having a first pixel density and a second area of the array having a second pixel density lower than the first pixel density. The second area of the array includes a plurality of the array sites that are devoid of pixels, where rows of the second area that border the first area include at least one pixel and columns of the second area that border the first area include at least one pixel.

The foregoing and other embodiments can each optionally include one or more of the following features, alone or in combination. For instance, in some aspects the plurality of array sites are arranged in the array such that distances between the array sites are uniform. In certain aspects, the plurality of array sites are uniformly distributed by location across both the first area of the array and the second area of the array. In some implementations, each array site in the plurality of array sites are a same size.

In some aspects, the first area of the array includes a plurality of the array sites that each includes a pixel. In certain aspects, all the array sites included in the first area each include a pixel and no array sites in the first area are devoid of pixels. In some implementations, the second area of the array is enclosed by the first area of the array.

In some aspects, rows of the second area that border the first area each include at least one pixel and at least one array site devoid of pixels. In certain aspects, the rows of the second area that border the first area include a top most row of the second area and a bottom most row of the second area that each comprise both at least one pixel and at least one array site devoid of pixels, where the second area includes at least one row that borders the first area that does not include pixels. In some implementations, the top most row of the second area and the bottom most row of the second area each include an alternating pattern of a pixel and an array site devoid of pixels. In some aspects, a row of the second area adjacent to a top most row of the second area and a row of the second area adjacent to a bottom most row of the second area each include only array sites devoid of pixels.

In certain aspects, columns of the second area that border the first area each include at least one pixel and at least one array site devoid of pixels. In some implementations, each array site at corners of the second area includes a pixel. In some aspects, the columns of the second area that border the first area include a left most column of the second area and a right most column of the second area that each comprise both at least one pixel and at least one array site devoid of pixels, where the second area includes at least one column that borders the first area that does not include pixels. In some implementations, the left most column of the second area and the right most column of the second area each include an alternating pattern of a pixel and an array site devoid of pixels. In certain aspects, a column of the second area adjacent to a left most column of the second area and a column of the second area adjacent to a right most column of the second area each include only array sites devoid of pixels.

In some aspects, each array site in the second area that is horizontally or vertically adjacent to an array site at a corner of the second area is devoid of a pixel. In certain aspects, the first area includes four times the pixel density of the second area. In some implementations, the first area includes nine times the pixel density of the second area. In some aspects, the display panel is an organic light emitting (OLED) display panel.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
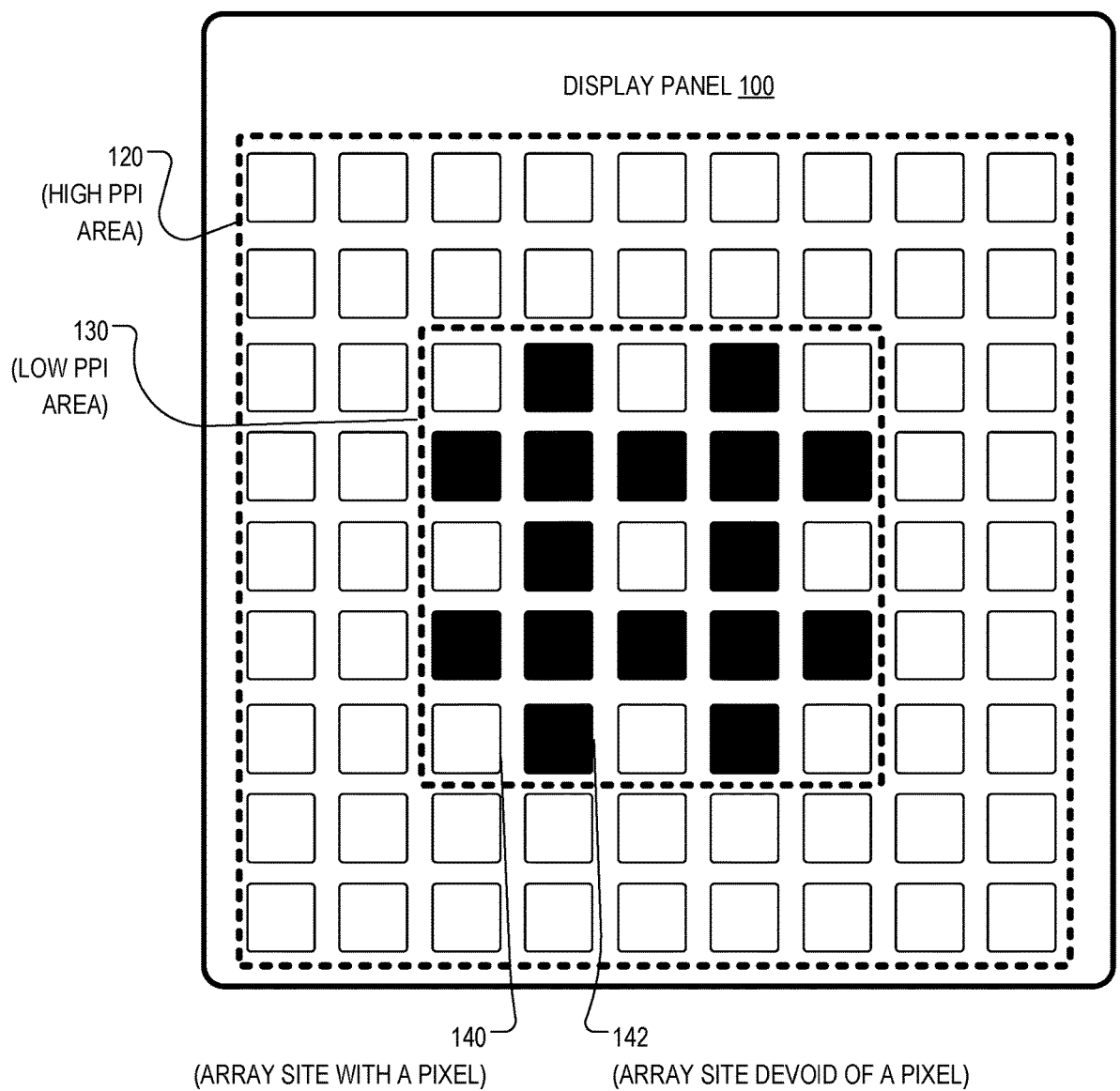
FIG. 1 is a conceptual diagram of a multi-pixel density display panel that compensates for dark artifacts.

FIG. 1 is a conceptual diagram of a multi-pixel density display panel 100 that compensates for dark artifacts. The panel 100 includes a plurality of array sites. In particular, FIG. 1 shows the panel 100 as including a plurality of array sites arranged in an array defined by a plurality or rows and a plurality of columns. For example, the panel 100 includes eighty one array sites arranged in an array defined by nine rows and nine columns. The panel 100 may be an organic light emitting (OLED) display panel, a liquid crystal display (LCD) panel, or some other type of panel.

An array site may be a location in the panel 100 that can either include a pixel or be devoid of a pixel. For example, an array site may form a hole so be devoid of a pixel, or the array site may not form a hole and instead include a pixel. In FIG. 1, an array site 140 is shown as including a pixel as the array site 140 is filled in with white, and an array site 142 is shown as being devoid of a pixel as the array site 142 is filled in with black. FIG. 1 shows sixteen array sites filled in with black, representing sixteen array sites devoid of pixels, and sixty five array sites filled in with white, representing sixty five array sites with pixels.

The panel 100 includes a first area 120 of the array that has a first pixel density and a second area 130 of the array that has a second pixel density. For example, the first area 120 includes the array sites between the outer dotted box and the inner dotted box, and the second area 130 includes the array sites within the inner dotted box, where the second area 130 has a quarter of the pixel density of the first area 120. The second area 130 of the array may be enclosed by the first area 120 of the array. For example, in FIG. 1 the second area is shown as a five by five array of array sites surrounded by array sites in the first area 120 that are two array sites deep.

The first area 120 of the array may include a plurality of the array sites that each includes a pixel. For example, as shown in FIG. 1, all the array sites in the first area 120 are shown filled in with white to represent they include pixels. All the array sites included in the first area may each include a pixel and no array sites in the first area may be devoid of pixels. Again, for example, as shown in FIG. 1, all the array sites in the first area 120 are shown filled in with white to represent they include pixels.

The first area 120 may include four times the pixel density of the second area 130. For example, as shown in FIG. 1, for every four array sites in the first area 120 that includes a pixel, the second area 130 includes three array sites devoid of pixels and one array site with a pixel. However, other panel with different pixel densities between a first area and a second area may also compensate for artifacts. For example, a first area may have nine times the pixel density of a second area.

In the panel 100, the plurality of array sites are arranged in the array such that distances between the array sites are uniform. For example, a center of each of the array sites in the panel 100 may be thirty micrometers (μm) from a center of any array site that is vertically or horizontally adjacent. In the panel 100, each array site in the plurality of array sites is a same size. For example, each of the array sites may be ninety μm$^2$.

In the panel 100, the plurality of array sites may be uniformly distributed by location across both the first area of the array and the second area of the array. For example, the distance between the centers of the array site in the second left most column in the panel 100 and the third row in the panel 100 and the array site in the third left most column in the panel 100 and the third row in the panel 100 may be the same as the distance between the centers of the array site in the left most column in the panel 100 and the third row in the panel 100 and the array site in the second left most column in the panel 100 and the third row in the panel 100.

The panel 100 may compensate for dark artifacts as both rows of the second area 130 that border the first area 120 include at least one pixel and both columns of the second area 130 that border the first area 120 include at least one pixel. For example, as shown in FIG. 1, the left column of array sites in the second area 130, the right column of array sites in the second area 130, the top row of array sites in the second area 130, and the bottom row of array sites in the second area 130 each include three array sites with pixels.

Both rows of the second area 130 that border the first area may each include at least one pixel and at least one array site devoid of pixels. For example, as shown in FIG. 1, the top row and the bottom row of the second area 130 each include three array sites with pixels and two array sites devoid of pixels. Both columns of the second area 130 that border the first area each include at least one pixel and at least one array site devoid of pixels. For example, as shown in FIG. 1, the left column and the right column of the second area 130 each include three array sites with pixels and two array sites devoid of pixels.

Each array site at corners of the second area 130 includes a pixel. For example, as shown in FIG. 1, the upper left most, upper right most, lower left most, and lower right most array site in the second area 130 each include a pixel. Each array site in the second area 130 that is horizontally or vertically adjacent to an array site at a corner of the second area may be devoid of a pixel. For example, as shown in FIG. 1, the array sites in the second area 130 that are adjacent to the array sites at the corners of the second area 130 are all devoid of pixels.

Other multi-pixel density panels than the panel 100 shown in FIG. 1 may similarly compensate for artifacts. For example, another panel may instead include a second area that includes the nine array sites in the upper left of the second area 130 shown in FIG. 1. These other multi-pixel density panels may compensate for artifacts in that both rows of a second area that border a first area include at least one pixel and both columns of the second area that border the first area include at least one pixel.

Figure 2:
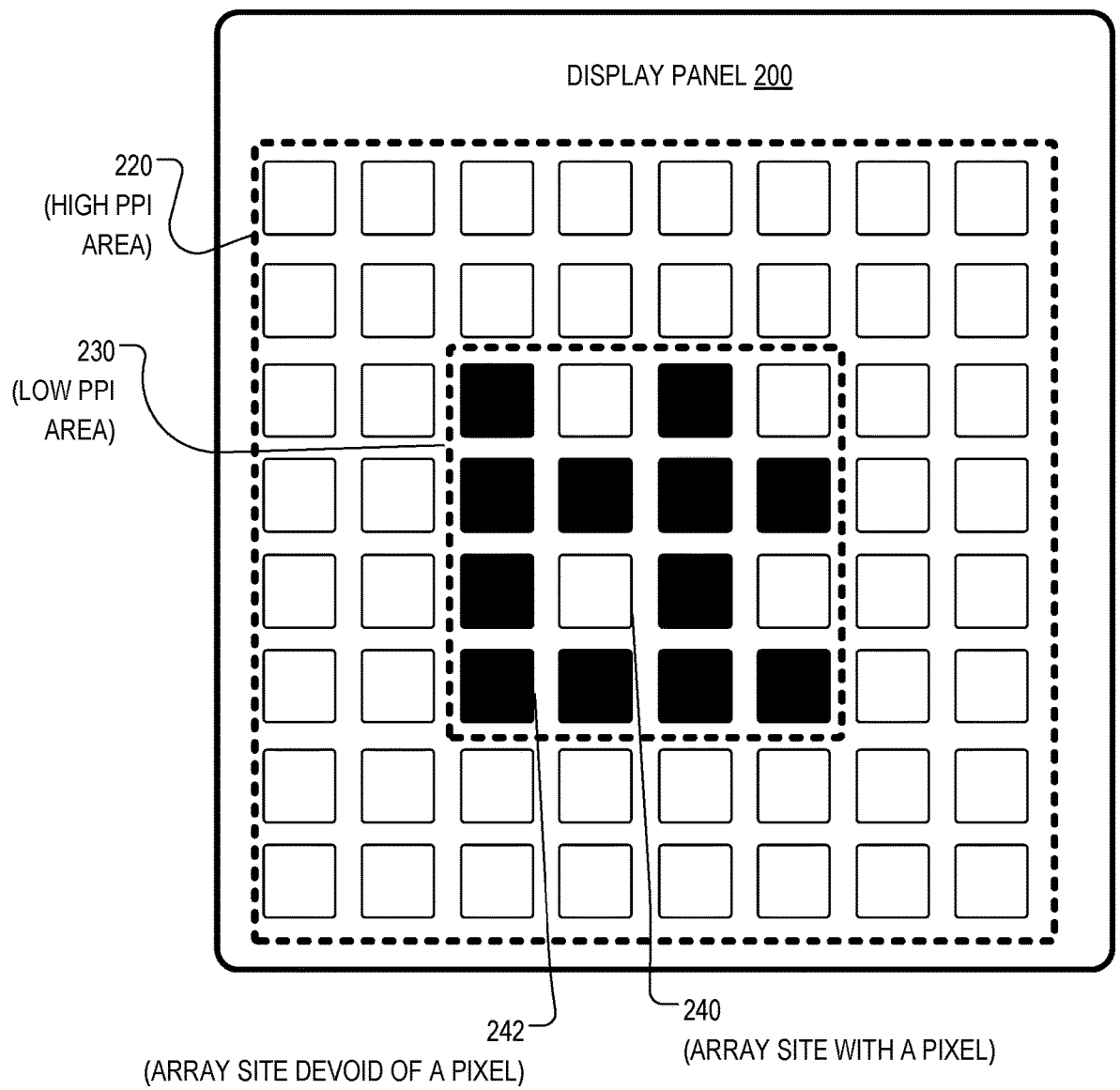
FIG. 2 is a conceptual diagram of a multi-pixel density display panel that does not compensate for dark artifacts.

FIG. 2 is a conceptual diagram of a multi-pixel density display panel 200 that does not compensate for dark artifacts. The panel 200 may be similar to the panel 100 in that the panel 200 includes a plurality of array sites arranged in an array defined by a plurality or rows and a plurality of columns, also includes a first area 220 with a higher pixel density than a second area 230, array sites with pixels are shown filled in with white, e.g., array site 240, and array sites devoid of pixels are shown filled in with black, e.g., array site 242.

However, the panel 200 may differ from panel 100 in that the panel 200 may not compensate for dark artifacts as both rows of the second area 230 that border the first area 220 do not include at least one pixel and both columns of the second area 230 that border the first area 220 do not include at least one pixel. For example, the left most column in the second area 230 includes only array sites that are devoid of pixels and the bottom most row in the second area 230 includes only array sites that are devoid of pixels.

In this example, pixels in the first area 220 that are adjacent to the left most column and bottom most row of array sites in the second area 230, that are devoid of pixels, may be darkened to better match the left most column and the bottom most row of array sites in the second area 230. However, darkening those pixels in the first area 220 may result in those array sites being constantly dark, and those array sites in combination with the array sites in the second area 230 that are devoid of pixels may form a large group of array sites that are dark and result in a dark artifact.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Thus, though particular embodiments of the subject matter have been described. These, and other embodiments, may fall within the scope of the following claims.

What is claimed is:

1. A display panel, comprising:
a plurality of array sites arranged in an array defined by a plurality of rows and a plurality of columns, the display panel comprising a first area of the array having a first pixel density and a second area of the array having a second pixel density lower than the first pixel density, the second area of the array having the second pixel density that is lower than the first pixel density as a result of the array comprising a plurality of the array sites that are devoid of pixels,
a top most row of the second area comprises at least one array site having a pixel and at least one array site devoid of a pixel,
a bottom most row of the second area comprises at least one array site having a pixel and at least one array site devoid of a pixel,
an intermediate row between the top and the bottom most rows of the second area, the intermediate row including fewer pixels than the top most row of the second area and fewer pixels than the bottom most row of the second area, and
the first area borders the second area on multiple sides of the second area.

2. The display panel of claim 1, wherein the plurality of array sites are arranged in the array such that distances between the array sites are uniform.

3. The display panel of claim 1, where the plurality of array sites are uniformly distributed by location across both the first area of the array and the second area of the array.

4. The display panel of claim 1, wherein each array site in the plurality of array sites are a same size.

5. The display panel of claim 1, wherein the first area of the array comprises a plurality of the array sites that each includes a pixel.

6. The display panel of claim 1, wherein all the array sites included in the first area each include a pixel and no array sites in the first area are devoid of pixels.

7. The display panel of claim 1, wherein rows of the second area that border the first area each comprise at least one pixel and at least one array site devoid of pixels.

8. The display panel of claim 1, wherein the top most row of the second area and the bottom most row of the second area each comprise an alternating pattern of a pixel and an array site devoid of pixels.

9. The display panel of claim 1, wherein a row of the second area adjacent to the top most row of the second area and a row of the second area adjacent to the bottom most row of the second area each comprise only array sites devoid of pixels.

10. The display panel of claim 1, wherein columns of the second area that border the first area each comprise at least one pixel and at least one array site devoid of pixels.

11. The display panel of claim 1, wherein the columns of the second area that border the first area comprise:
a left most column of the second area and a right most column of the second area that each comprise both at least one pixel and at least one array site devoid of pixels,
wherein the second area includes at least one column between the left most column of the second area and the right most column of the second area that does not include pixels.

12. The display panel of claim 11, wherein the left most column of the second area and the right most column of the second area each comprise an alternating pattern of a pixel and an array site devoid of pixels.

13. The display panel of claim 1, wherein a column of the second area adjacent to a left most column of the second area and a column of the second area adjacent to a right most column of the second area each comprise only array sites devoid of pixels.

14. The display panel of claim 1, wherein each array site at corners of the second area includes a pixel.

15. The display panel of claim 1, wherein each array site in the second area that is horizontally or vertically adjacent to an array site at a corner of the second area is devoid of a pixel.

16. The display panel of claim 1, wherein the first area includes four times the pixel density of the second area.

17. The display panel of claim 1, wherein the first area includes nine times the pixel density of the second area.

18. The display panel of claim 1, wherein the display panel is an organic light emitting (OLED) display panel.

19. The display panel of claim 1, wherein the first area surrounds the second area on four sides of the second area.

* * * * *